United States Patent [19]
Lin et al.

[11] Patent Number: 6,030,167
[45] Date of Patent: Feb. 29, 2000

[54] APPARATUS FOR LOADING WAFERS INTO A HORIZONTAL QUARTZ TUBE

[75] Inventors: Peter Yu-Tsai Lin, Miao Li; Eric Chu, Hsinchu, both of Taiwan

[73] Assignee: United Microeletronics Corp., Hsinchu, Taiwan

[21] Appl. No.: 08/905,802

[22] Filed: Aug. 12, 1997

[51] Int. Cl.[7] .................................................. F27D 3/00
[52] U.S. Cl. ..................... 414/160; 432/239; 414/589; 414/940; 414/749; 414/222; 118/729
[58] Field of Search ............................. 432/11, 208, 239, 432/258, 23; 414/160, 147, 152, 222, 935, 939, 940, 589, 590, 586, 741, 750, 156; 269/1, 17, 55, 56, 71, 909; 118/729, 719

[56] References Cited

U.S. PATENT DOCUMENTS

| | | | |
|---|---|---|---|
| 4,253,792 | 3/1981 | Nishikawa | 414/589 |
| 4,468,195 | 8/1984 | Sasaki et al. | 432/239 X |
| 4,543,059 | 9/1985 | Whang et al. | 414/940 X |
| 4,744,712 | 5/1988 | Mitchell | 414/940 X |
| 4,876,225 | 10/1989 | Wagner et al. | 414/940 X |

Primary Examiner—Frank E. Werner
Attorney, Agent, or Firm—Pennie & Edmonds LLP

[57] ABSTRACT

An apparatus for loading wafers into horizontal quartz tube, the apparatus includes a base plate, holding plate, trolley main body and two supporting bases. The base plate has a plurality of stages, which is lifted by a loading rod and fixed atop thereon, for placing wafers. The holding plate has a plurality of fixing screws and altitude adjusting screws for supporting the base plate and changing an altitude of the base plate to match an altitude of wafer boat. The trolley main body, which supports the holding plate by supporting pillars, provides with a plurality of position holes for carrying the holding plate and moving the base plte. The two supporting bases are connected by a solid plate, whose both ends are respectively attached at hollows formed at the middle of each of the two supporting bases. The two supporting bases are provided with a pair of slide bearings on either side of the solid plate. The slide bearings are fitted with two parallel silde shafts out of the horizontal quartz tube, thereby allowing the two supporting bases to travel along the slide shaft into and out of the horizontal quartz tube. In addition, the supporting bases have several pins adapted to mate with the position holes of the trolley main body to mount the trolley main body on the solid plate, thereby allowing the wafer boat to move along with the two supporting bases.

4 Claims, 6 Drawing Sheets

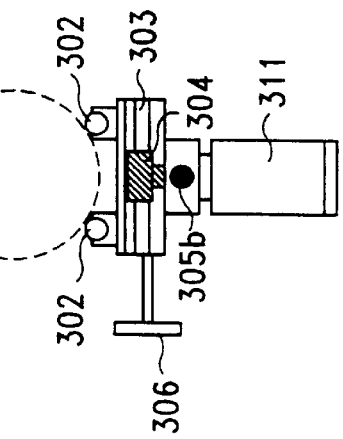
FIG. 3D (Prior Art)
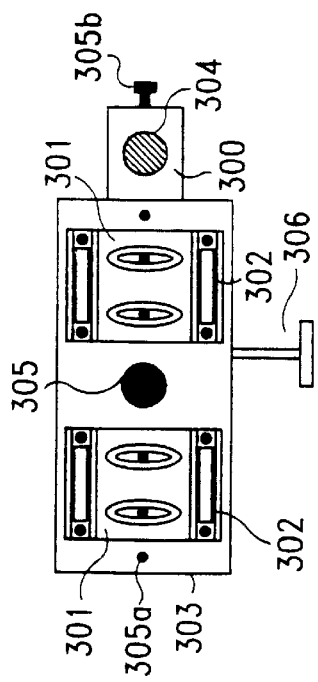
FIG. 3A (Prior Art)
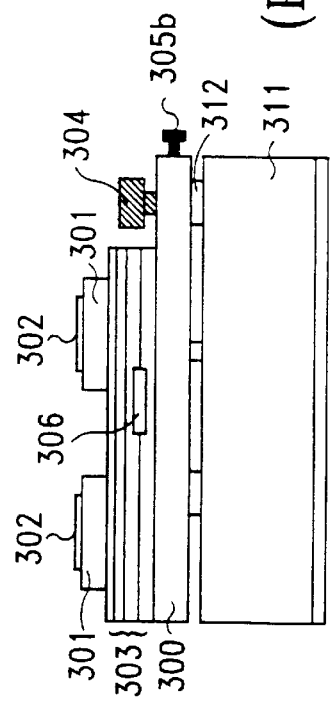
FIG. 3B (Prior Art)
FIG. 3C (Prior Art)

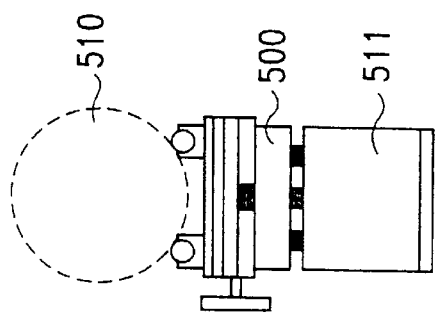
FIG.5D
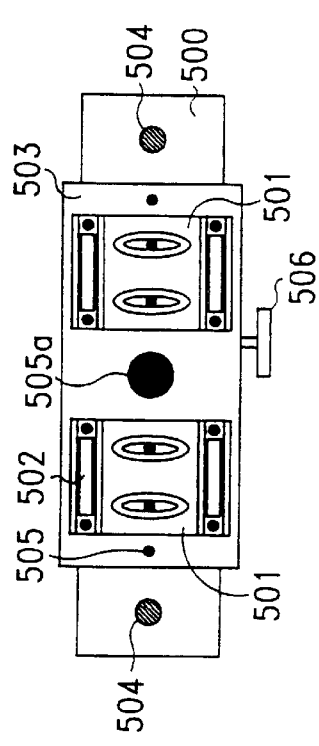
FIG.5A
FIG.5B
FIG.5C

APPARATUS FOR LOADING WAFERS INTO A HORIZONTAL QUARTZ TUBE

FIELD OF THE INVENTION

The present invention relates to an apparatus for loading wafers into a horizontal quartz tube.

BACKGROUND OF THE INVENTION

Conventional semiconductor processing equipment includes four parts: source cabinet 11, furnace module 12, load station 13, and controller 14, as shown in FIG. 1. Furnace module 12 contains an inner horizontal quartz tube 101 and outer horizontal quartz tube 101a for processing wafers. The outside wall of the outer horizontal quartz tube 101a is surrounded by heating elements 102 for heating wafers loaded inside it. Wafers are placed on the top of the boat 105 and delivered by the trolley 103 into horizontal quartz tube. Source cabinet 11 contains gas piping (not shown in FIG. 1) and a mass flow controller (not shown in FIG. 1). At the close end of inner horizontal quartz tube 101, an inlet pipe 106 of a gas injector introduces $N_2$ gas into the horizontal quartz tube. At the left side end of outer quartz tube (reference to FIG. 1), an opening 106a introduces reaction gas into the horizontal quartz tube, such as, $O_2$, $H_2$, or $POCl_3$ and so on. Controller 14 controls the factors of processing wafers, such as, temperature, timing, air, and recipe.

FIG. 2A shows the loading station of a conventional furnace module with inner 201 and outer 202 horizontal quartz tubes. A trolley 200a with slide bearings is set on parallel slide shafts, and two boats 203a are put on a base boat 203, which is placed on the trolley. Wafers 210 are placed on the boats 203a of the trolley, and then loaded into the horizontal inner quartz tube 201 of the furnace module through the opening 201a of the inner quartz tube 201. In the front section of the inner quartz tube 201 near the opening of the tube, there is a breach 201a at the bottom of the tube. After the wafers are loaded into the inner quartz tube, the whole inner quartz tube 201 is encased by the outer quartz tube 202, and then the process of semiconductor is performed. FIG. 2B is a cross-sectional view of the inner quartz tube 201. In the front section of the inner quartz tube 201 near the opening of the tube, there is a breach 201a at the bottom of the tube. Therefore, the base boat 203 loaded with wafers (not shown in FIG. 2B) can be moved into the inner quartz tube 201 through the breach 201a.

FIG. 3A shows the top view of a conventional trolley. Referring to FIG. 3A, two stages 301 with two quartz bars 302 are respectively fixed on a base plate 303 which is placed on a holding plate 300. The quartz bars are used for preventing the base boat contacting with the stages 301. An altitude adjusting screw 304 is used for adjusting the altitude of base plate 303. After the altitude of the base plate 303 is adjusted, a first fixing screw 305b is used to fix the altitude adjusting screw 304. A plurality of second set of fixing screws 305 are used to fix the base plate 303 on the holding plate 300, and a plurality of third set of fixing screws 305a are used to fix the two stages 301 on the base plate 303. A loading rod 306 is used for lifting the base plate 303 from the trolley by turning it. FIG. 3B, a cross-sectional view of the conventional trolley, shows connections among the base plate 303, holding plate 300, and main body 311 of the trolley. The altitude of the holding plate 300 is adjustable by turning the altitude adjusting screw 304, and the holding plate 300 and main body 311 of trolley are connected by a plurality of supporting pillars 312.

FIG. 3C shows the bottom view of the conventional trolley 300. A plurality of fourth set of fixing screws 305c are used for fixing the trolley with the main body 311, and a position hole 307 is used for locating the trolley on the supporting base. FIG. 3D, the right side view of the conventional trolley, demonstrates the position which the wafers and boats 310 are placed on.

FIG. 4A shows the top view of a supporting base of the conventional trolley. A plurality of fourth set of fixing screws 405 are used for fixing the top plate 400 of the supporting base on the slide bearings, and a position pin 409 is used to locate the trolley by the position hole 307 shown in FIG. 3C. FIG. 4B shows the cross-sectional view of the supporting base of the conventional trolley. The slide bearings 408 are fitted with two parallel slide shafts 410, so as to be allowed moving back and forth in the axial direction of the slide shafts. FIG. 4C shows the right view of the supporting base of the conventional trolley.

Using the conventional trolley to load the wafers into the horizontal inner quartz tube has some disadvantages. For example, since the trolley supporting base is nearby the furnace module, users may get hurt due to the high temperature of furnace module. In addition, the trolley is not easy to locate on the trolley supporting base. Further, the contact area 411 (Showen in FIG. 4A) between the trolley and the trolley supporting base is relatively small, so the boats and the wafers placed on the trolley are easily oscillated and turned over during the time of loading wafers.

SUMMARY OF THE INVENTION

An apparatus for loading wafers into horizontal quartz tube, the apparatus includes a base plate, holding plate, trolley main body and two supporting bases. The base plate has a plurality of stages, which is lifted by a loading rod and fixed atop thereon, for placing wafers. The holding plate has a plurality of fixing screws and altitude adjusting screws for supporting the base plate and changing an altitude of the base plate to match an altitude of wafer boat. The trolley main body, which supports the holding plate by supporting pillars, provides with a plurality of position holes for carrying the holding plate and moving the base plte. The two supporting bases are connected by a solid plate, whose both ends are respectively attached at hollows formed at the middle of each of the two supporting bases. The two supporting bases are provided with a pair of slide bearings on either side of the solid plate. The slide bearings are fitted with two parallel silde shafts out of the horizontal quartz tube, thereby allowing the two supporting bases to travel along the slide shaft into and out of the horizontal quartz tube. In addition, the supporting bases have several pins adapted to mate with the position holes of the trolley main body to mount the trolley main body on the solid plate, thereby allowing the wafer boat to move along with the two supporting bases.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3A is the top view of a conventional trolley;

FIG. 3B is the cross-sectional view of a conventional trolley;

FIG. 3C is the bottom view of a conventional trolley;

FIG. 3D is the right side view of a conventional trolley;

FIG. 5A is the top view of a trolley of the present invention;

FIG. 5B is the cross-sectional view of a trolley of the present invention;

FIG. 5C is the bottom view of a trolley of the present invention;

FIG. 5D is the right side view of a trolley of the present invention;

DETAILED DESCRIPTION OF THE PREFERRED EMBODIMENT

Figure 1:
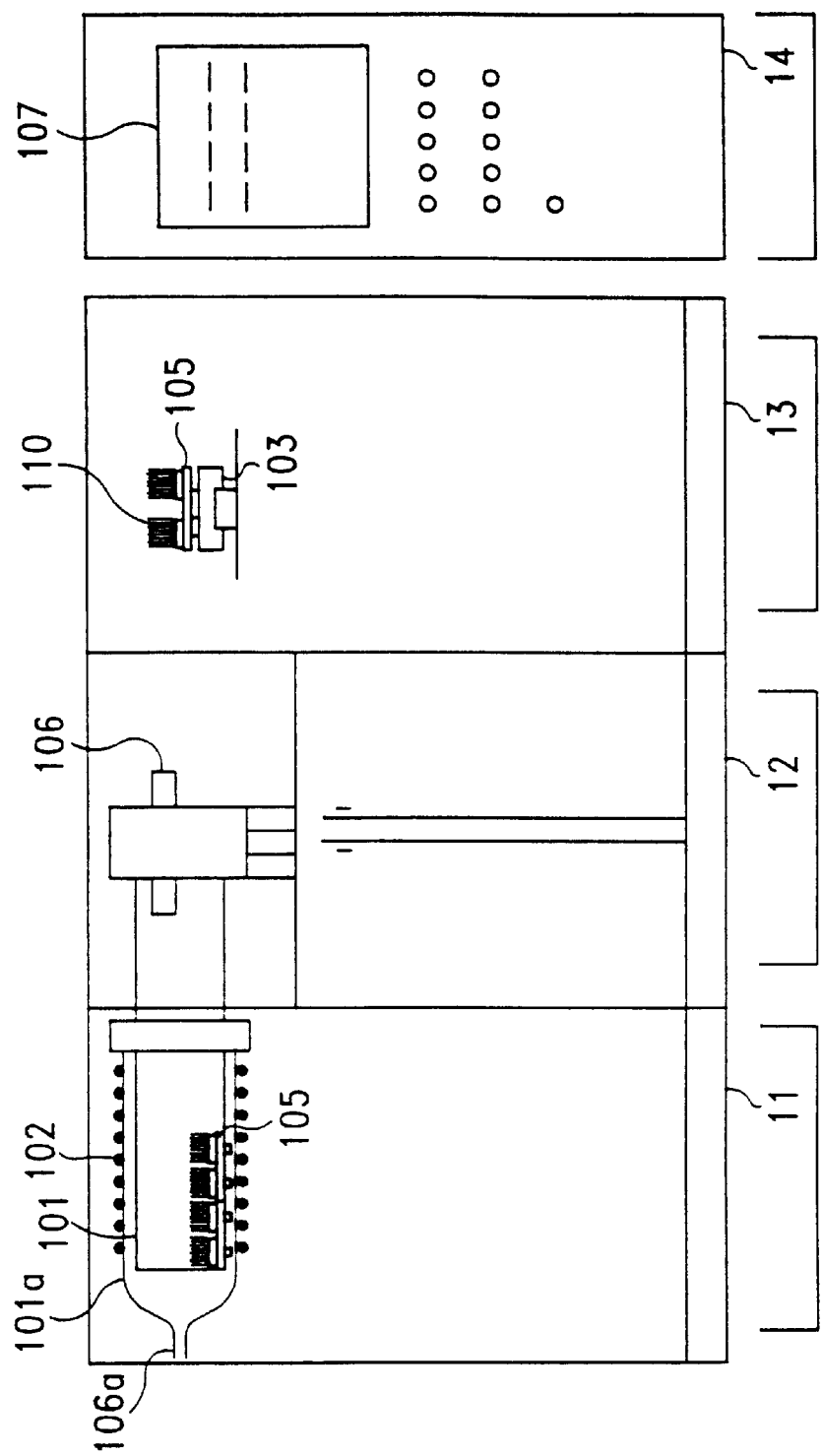
FIG. 1 is a schematic diagram showing a conventional semiconductor processing equipment which contains a horizontal quartz tube for processing wafers.
Figure 2A:
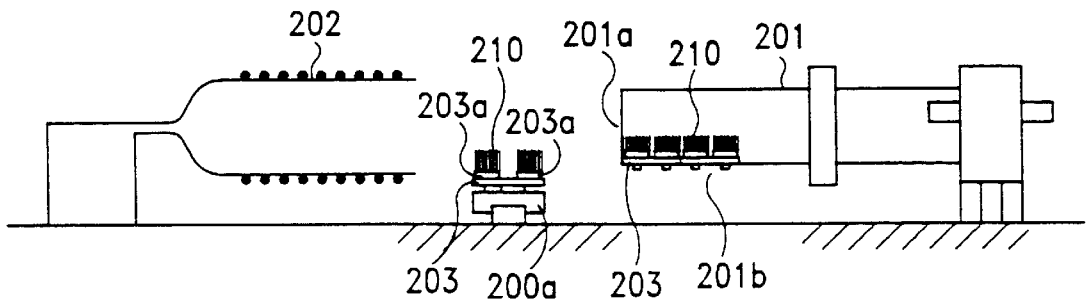
FIG. 2A is a schematic diagram showing the loading station of a conventional furnace module with inner and outer horizontal quartz tube.
Figure 2B:
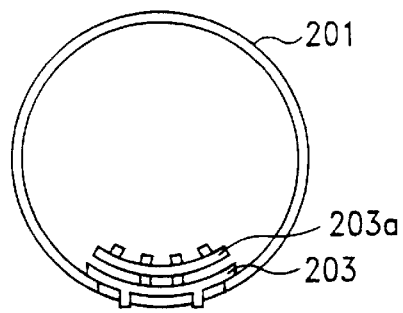
FIG. 2B is the cross-sectional view of the inner quartz tube.

The present invention relates to an apparatus for loading wafers into a horizontal quartz tube. The present invention will be described in detail with reference to drawings.

FIG. 5A shows the top view of a trolley of the present invention. Referring to FIG. 5A, two stages 501 with two quartz bars 502 are respectively fixed on a base plate 503 which is placed on a holding plate 500. The quartz bars 502 are used for preventing the quartz boats contacting with the stages 501. An altitude adjusting screw 504 is used for adjusting the altitude of base plate 503. A first fixing screw 505a is used to fix the base plate 503 on the holding plate 500, and a plurality of second set of fixing screws 505 is used to fix the two stages 501 on the base plate 503. A loading rod 506 is used for lifting the base plate 503 from the trolley by turning it.

FIG. 5B, a cross-sectional view of the trolley of present invention, shows the connections among the base plate 503, holding plate 500, and main body 511 of the trolley. The altitude of the holding plate 500 is adjusted by the altitude adjusting screw 504, and the holding plate 500 and the main body 511 of trolley is connected by a plurality of supporting pillars 512. When the trolley is moved near the opening of the inner quartz tube and prepared to load wafers into the tube, the altitude of the base plate 503 needs be adjusted to match the altitude of the horizontal inner quartz tube.

Figure 4C:
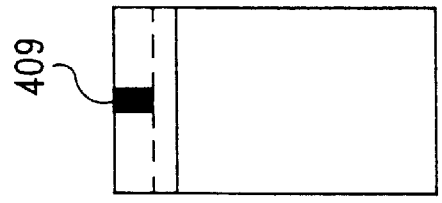
FIG. 4C is the right side view of the supporting basis of a conventional trolley.
Figure 4A:
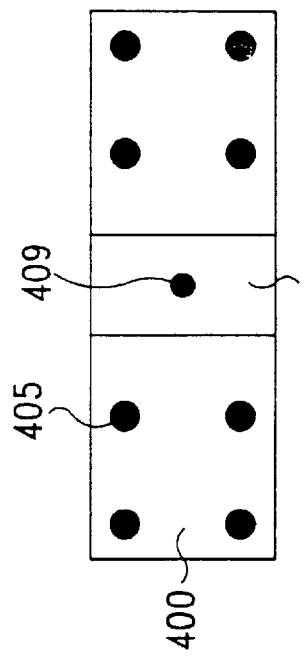
FIG. 4A is the top view of the supporting basis of a conventional trolley.
Figure 4B:
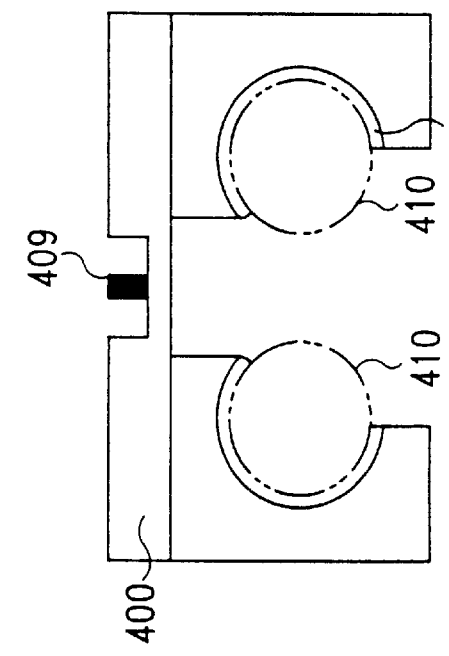
FIG. 4B is the cross-sectional view of the supporting basis of a conventional trolley.

FIG. 5C shows the bottom view of the trolley in the present invention. A plurality of third set of fixing screws 505b are used for fixing the trolley with the main body 511, and a plurality of position holes 507 are also used for locating the trolley on the supporting bases. FIG. 5D, the right side view of the trolley in the present invention, demonstrates the position which the wafers and boats 510 are placed on. Still referring to FIG. 5D, the widths of the holding plate 500 and main body 511 of the trolley are enlarged, so the contact areas (will show in FIG. 6A) of trolley and supporting bases are larger than the conventional trolley (see FIG. 4A).

Figure 6C:
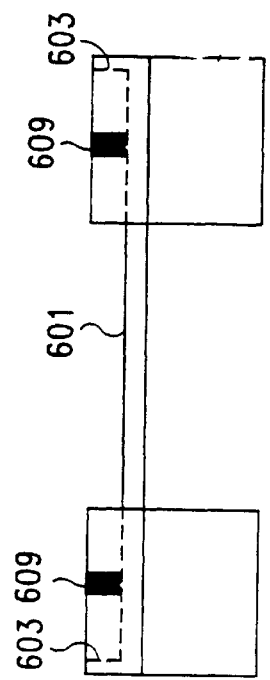
FIG. 6C is the right side view of the supporting basis of a trolley of the present invention.
Figure 6A:
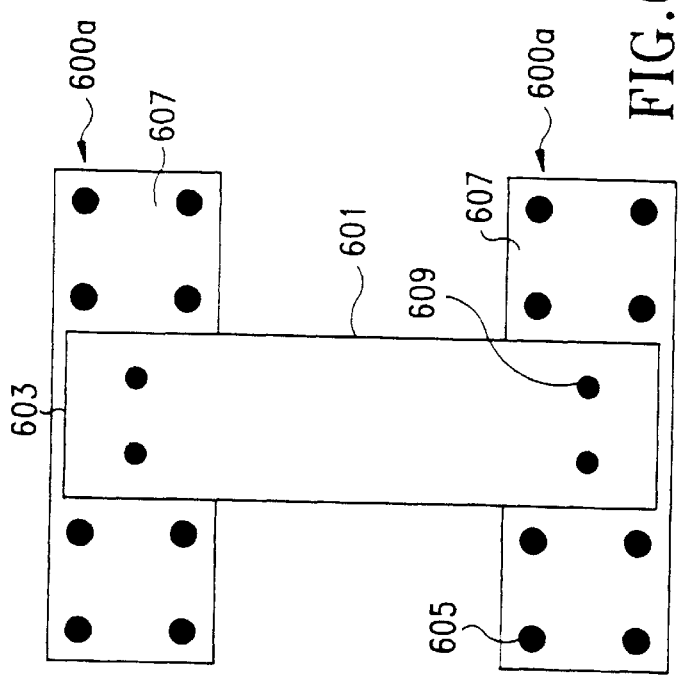
FIG. 6A is the top view of the supporting basis of a trolley of the present invention.
Figure 6B:
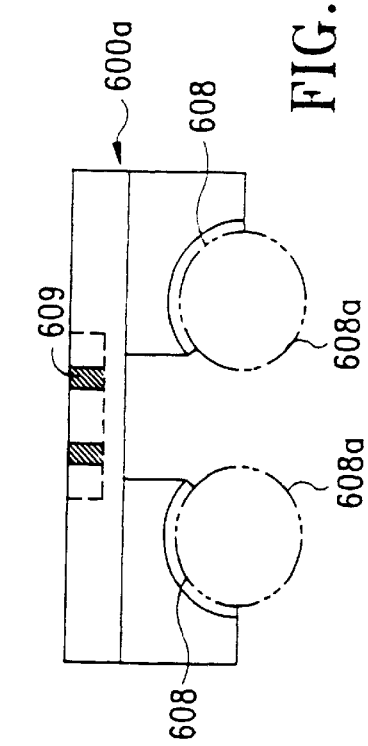
FIG. 6B is the cross-sectional view of the supporting basis of a trolley of the present invention.

FIG. 6A, shows the top view of two supporting bases 600a of the trolley of the present invention. The two supporting bases 600a are connected by a solid plate 601, which is attached at hollows formed at the middle of each of the two supporting bases. Then, the position sides 603 at both end of the solid plate 601 are shapped by the overlapped regions of the two supporting bases and solid plate 601. The trolley becomes more easily to locate on the supporting bases 600a due to the two position sides 603 and the enlarged contact areas. A plurality of fixing screws 605 are used for fixing the two top plates 607 of the supporting base 600a on the two slide bearings, respectively. A plurality of position pins 609 are used to locate the trolley on the supporting bases 600a by matching them with the position holes 507 illustrated in FIG. 5C. FIG. 6B shows the cross-sectional view of the supporting bases 600a of the trolley of the present invention. The slide bearings 608 are shortened and set on the two parallel slide shafts 608a, thereby to be allowed to move back and forth in the axial direction of the slide shafts. Because the slide bearings 608 are shortened and set higher than the geographic centers of the slide shafts 608a, the supporting base can be lifted from the slide shafts and apart from the furnace module, thereby keeping the supporting bases in the room temperature. FIG. 6C shows the right view of the supporting bases of the trolley of the present invention.

The arrangement of the trolley in the present invention provides the improvements or changes as follows: (1) the contact area of trolley and the supporting bases are enlarged relatively to the conventional trolley; (2) the slide bearings are shortened and set higher than the geographic centers of the parallel shafts, so the supporting bases can separate from them and taken away from the furnace module; (3) the trolley becomes more easily to place on the supporting bases by the locations of the two positioned sides and increased position pins and holes; (4) the supporting bases improved from one base to two bases and connected with a solid plate increase the stability of the trolley in the period of loading process. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A semiconductor wafer loading apparatus for loading wafer boats into a horizontal quartz tube to thermally treat wafers on the wafer boats, said apparatus comprising:

a base plate having stages fixed on a top surface of the base plate, a plurality of quartz bars being mounted upon the stages to form U-shaped shelves for supporting the wafer boats;

a holding plate positioned beneath the base plate and connected thereto by fixing screws for supporting the base plate;

a trolley main body having a bottom surface provided with a plurality of position holes, the trolley main body positioned beneath the holding plate and connected thereto by supporting pillars for carrying the holding plate and moving the base plate; and two spaced apart supporting bases connected by a solid plate, opposite ends of the solid plate being attached at hollows formed at the middle of each of the two supporting bases, the two supporting bases being provided with a pair of slide bearings provided on either side of the solid plate, the slide bearings being fitted with two parallel slide shafts out of the horizontal quartz tube, thereby allowing the two supporting bases to travel along the slide shafts into and out of the horizontal quartz tube, the supporting bases having a plurality of position pins adapted to mate with said position holes provided on the bottom surface of the trolley main body to mount the trolley main body on the solid plate, thereby allowing the wafer boat on the base plate to move into or out of the horizontal quartz tube along with the two supporting bases.

2. The apparatus of claim 1, wherein the holding plate has a plurality of adjusting screws used to change altitudes of the base plate and the holding plate for matching an altitude of the wafer boat on the base plate with an altitude of an opening of the horizontal quartz tube.

3. The apparatus of claim 1, wherein the slide bearings are set higher than geographic centers of the slide shafts such that, after the wafer boat is sent into the horizontal quartz tube, the trolley main body, the holding plate, the base plate, and the two supporting bases are spaced apart from the two parallel shafts so as to prevent them from being heated by the horizontal quartz tube.

4. A semiconductor wafer loading apparatus for loading wafer boats into a horizontal quartz tube to thermally treat wafers on the wafer boats, said apparatus comprising a base plate having stages fixed on a top surface of the base plate, a plurality of quartz bars being mounted upon the stages to form U-shape shelves for supporting the wafer boats;

a holding plate positioned beneath the base plate and connected thereto by fixing screws for supporting the base plate, the holding plate having a plurality of adjusting screws to change an altitude of the base plate and the holding plate to matching an altitude of the wafer boat on the base plate with altitude of an opening of the horizontal quartz tube;

a trolley main body having a bottom surface provided with a plurality of position holes, the trolley main body positioned beneath the holding plate and connected thereto by supporting pillars for carrying the holding plate and moving the base plate; and two spaced apart supporting bases connected by a solid plate, opposite ends of the solid plate being attached at hollows formed at the middle of each of the two supporting bases, the two supporting bases being provided with a pair of slide bearings provided on either side of the solid plate, the slide bearings being fitted with two parallel slide shafts out of the horizontal quartz tube, thereby allowing the two supporting bases to travel along the slide shafts into and out of the horizontal quartz tube, the supporting bases having a plurality of position pins adapted to mate with said position holes provided on the bottom surface of the trolley main body to mount the trolley main body on the solid plate, thereby allowing the wafer boat on the base plate to move into or out of the horizontal quartz tube along with the two supporting bases, wherein the slide bearings are set higher than geographic centers of the slide shaft such that, when the wafer boat is sent into the horizontal quartz tube, the trolley main body, the holding plate, the base plate, and the two supporting bases are spaced apart from the two parallel shafts to prevent them from being heated by the horizontal quartz tube.

* * * * *